United States Patent [19]

Yamamura et al.

[11] Patent Number: 5,008,728
[45] Date of Patent: Apr. 16, 1991

[54] SEMICONDUCTOR INTEGRATED CIRCUIT DEVICE HAVING AN IMPROVED ARRANGEMENT OF POWER SOURCE LINES

[75] Inventors: Takeshi Yamamura, Zama; Seiji Endo, Kawasaki; Kazuyuki Kawauchi, Yokohama; Hiroki Korenaga, Ichikawa, all of Japan

[73] Assignee: Fujitsu Limited, Kawasaki, Japan

[21] Appl. No.: 409,553

[22] Filed: Sep. 14, 1989

[30] Foreign Application Priority Data

Sep. 19, 1988 [JP] Japan .................. 63-234161

[51] Int. Cl.[5] .............................. H01L 27/10
[52] U.S. Cl. ....................... 357/45; 357/40; 357/71; 357/68
[58] Field of Search .............. 357/40, 45, 68, 71, 357/45 M

[56] References Cited

U.S. PATENT DOCUMENTS

| 4,568,961 | 2/1986 | Noto ........................... | 357/40 |
| 4,780,846 | 10/1988 | Tanabe et al. ................ | 357/45 |
| 4,811,073 | 3/1989 | Kitamura et al. ............. | 357/45 |
| 4,833,520 | 5/1989 | Ito et al. ..................... | 357/45 |

FOREIGN PATENT DOCUMENTS

| 0007140 | 1/1982 | Japan ..................... | 357/45 |
| 0142559 | 8/1983 | Japan ..................... | 357/45 |
| 59-207641 | 11/1984 | Japan . | |
| 0194739 | 8/1986 | Japan ..................... | 357/45 M |
| 0095653 | 4/1988 | Japan ..................... | 357/40 |
| 0152163 | 6/1988 | Japan ..................... | 357/40 |
| 0004055 | 1/1989 | Japan ..................... | 357/45 |

*Primary Examiner*—Rolf Hille
*Assistant Examiner*—Minh Loan Tran
*Attorney, Agent, or Firm*—Armstrong, Nikaido, Marmelstein, Kobovcik & Murray

[57] ABSTRACT

A semiconductor integrated circuit device includes a plurality of functional blocks each executing respective logic operations and arranged in an internal area on a semiconductor chip, and a first power source line arranged so as to surround the internal area. The first power source line is a closed-loop line. Second power source lines are provided for the respective functional blocks so as to surround the respective functional blocks on the chip. Each of the second power source lines is a closed-loop line. Third power source lines mutually connect the second power source lines for the functional blocks and connect the second power source lines and the first power source line.

19 Claims, 12 Drawing Sheets

SEMICONDUCTOR INTEGRATED CIRCUIT DEVICE HAVING AN IMPROVED ARRANGEMENT OF POWER SOURCE LINES

BACKGROUND OF THE INVENTION

The present invention generally relates to a semiconductor integrated circuit device having an improved arrangement of power source lines. More particularly, the present invention is directed to an improvement in routing power source lines of a standard cell type LSI (large scale integrated circuit).

Power consumption of LSI chips is trending to an increase with an increase in integration density and speeding up operation. Particularly, fineness of wiring patterns deteriorates resistance to electromigration and shortens the lifetime of LSI chips. From these viewpoints, effective and efficient power supply is required to fabricate reliable LSI chips. Further, automatic routing of power source lines by use of computer aided design (CAD) is required to reduce the time it takes to design LSI chips.

FIG. 1 is a plan view of a conventional standard cell-type LSI chip. Referring to FIG. 1, the chip includes main (primary) power source lines 1-6, secondary or auxiliary power source lines 7-16, functional blocks (modules) 17-20, and an input/output (I/O) circuit block 21. The functional blocks 17-20 provide respective logics. For example, an arithmetic logic unit (ALU) is formed by a functional block. The functional block 19 includes unit cell arrays 22 each providing an NAND circuit, for example. The main power source lines 1-6 extend to the vicinity of the functional blocks 17-20 from power source terminals (not shown) provided in the I/O circuit block 21. The auxiliary power source lines 7-14 extend to the functional blocks 17-20 from the main power source lines 1-6 close thereto. In each of the functional blocks 17-20, the auxiliary power source lines 15 and 16 couple the unit cell arrays 22 and the auxiliary power source lines 7-14. An auxiliary power source line extending above the unit cell arrays 22 supplies each of the unit cell arrays 22 with power.

However, the conventional layout of power source lines shown in FIG. 1 presents the following disadvantages. First, it is very difficult to automatically route power source lines through CAD because there are no rules of routing the main power source lines 1-6 and additionally there are no rules of connection between the main power source lines 1-6 and the I/O circuit blocks 21. Second, an increased number of the main power source lines 1-6 or a thicker main power source lines 1-6 are necessary to supply the functional blocks 17-20 with sufficient power. The arrangement is not suitable for automatic routing power source lines. Third, even when sufficient power is supplied to the functional blocks 17-20, cells located in the center of each array or its vicinity are not supplied with sufficient power if the widths of the auxiliary power source lines are not enough to supply the unit cells with sufficient power.

An integrated circuit chip directed to an improvement in a layout of power source lines has been disclosed in Japanese Laid-Open Patent Application No. 59-207641. A mother power source line is arranged so as to surround the entire internal area in which a plurality of functional blocks are formed. Main power source lines extending in a first direction (lateral direction) are arranged so as to connect opposite portions of the mother power source line. Supporting power source lines extending on the opposite sides of each of the functional blocks are arranged in a second direction perpendicular to the first direction so as to connect the supporting power source lines or between the supporting power source lines and the mother power source line. Power source lines which provide unit cell arrays with power extend so as to connect the supporting power source lines arranged on both the sides of each functional block.

However, the unit cell arrays are supplied with power only through the power source lines provided so as to connect the supporting power source lines extending only in the second direction. Therefore, the degree of freedom to route power source lines is poor. In other words, the aforementioned arrangements of power source lines are not suitable for automatic design of routing through CAD. Further, for the same reason, it is very difficult to make the distribution of current uniform over the power source lines.

SUMMARY OF THE INVENTION

Accordingly, a general object of the present invention is to provide a semiconductor integrated circuit device having an improved arrangement of power source lines.

A more specific object of the present invention is to provide a semiconductor integrated circuit device having an improved arrangement of power source lines which are suitable for automatic routing design by use of CAD.

Another object of the present invention is to provide a semiconductor integrated circuit device having an improved arrangement of power source lines capable of uniformly supplying functional blocks with necessary power.

The above objects of the present invention can be achieved by a semiconductor integrated circuit device comprising a plurality of functional blocks each executing respective logic operations and arranged in an internal area on a semiconductor chip, a first power source line arranged so as to surround the internal area, the first power source line being a closed-loop line, second power source lines provided for the respective functional blocks so as to surround the respective functional blocks on the chip, each of the second power source lines being a closed-loop line, and third power source lines mutually connecting the second power source lines for the functional blocks and connecting the second power source lines and the first power source line.

It is preferable to provide the above-mentioned structure for each of different potentials. That is, a semiconductor integrated circuit device comprising a plurality of functional blocks each executing respective logic operations and arranged in an internal area on a semiconductor chip, a first high-potential power source line arranged so as to surround the internal area, the high-potential first power source line being a closed-loop line, second high-potential power source lines provided for the respective functional blocks so as to surround the respective functional blocks on the chip, each of the second high-potential power source lines being a closed-loop line, third high-potential power source lines mutually connecting the second high-potential power source lines for the functional blocks and connecting the second high-potential power source lines and the first high-potential power source line. Further, the device includes a first low-potential power source line arranged so as to surround the internal area, the first low-potential power source line being a closed-loop line, second low-potential power source lines provided for the respective functional blocks so as to surround the respective functional blocks on the chip, each of the second low-potential power source lines being a closed-loop line, and third low-potential power source lines mutually connecting the second low-potential power source lines for the functional blocks and connecting the low-potential second power source lines and the first low-potential power source line.

Additional objects, features and advantages of the present invention will become apparent from the following detailed description when read in conjunction with the accompanying drawings.

DESCRIPTION OF THE PREFERRED EMBODIMENTS

Figure 1:
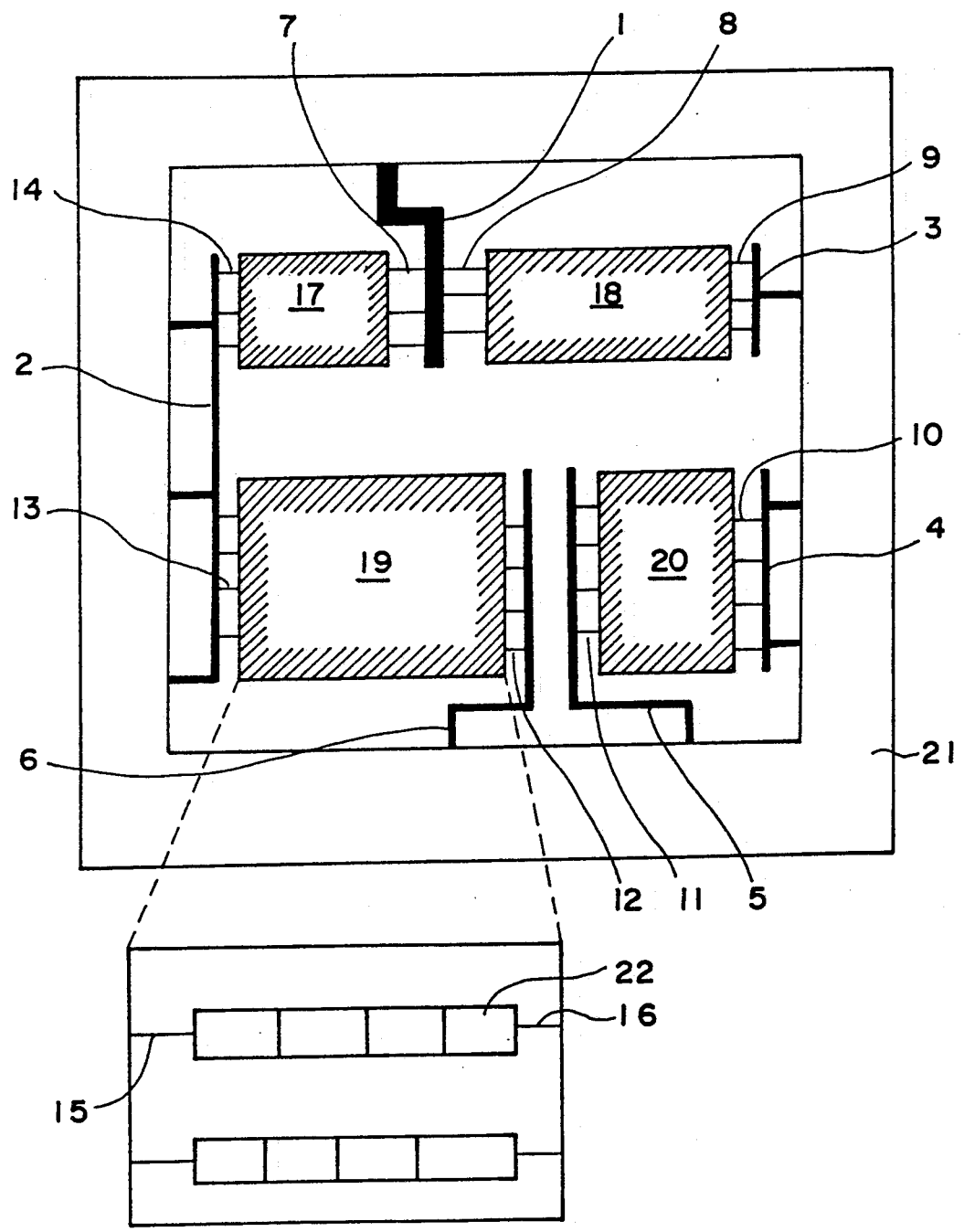
FIG. 1 is a plan view of a conventional integrated circuit chip.
Figure 2:
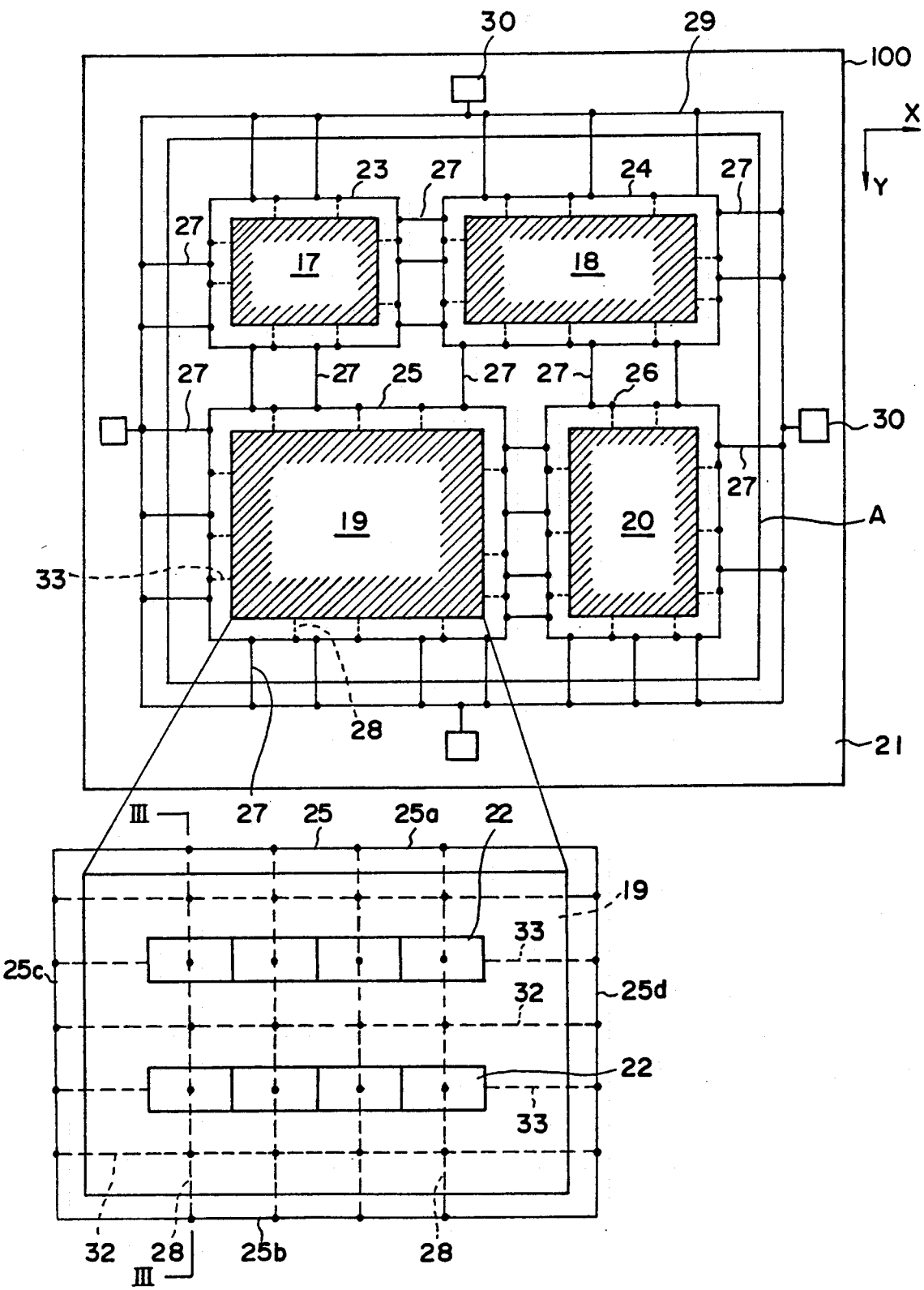
FIG. 2 is a plan view of a first preferred embodiment of the present invention.

A description is given of a first preferred embodiment of the present invention with reference to FIG. 2. Referring to FIG. 2, an integrated circuit chip 100 includes four functional blocks (modules) 17-20 such as an ALU or a RAM. Main power source lines (hereinafter simply referred to as main lines) 23-26 formed by closed-loop lines are arranged so as to surround the functional blocks 17-20, respectively. A plurality of sub power source lines (hereinafter simply referred to as sub-lines) 27 extend in the X and Y directions, and are arranged so as to connect the main lines 23-26 in the vicinity of the functional blocks 17-20. For example, the main line 23 for the functional block 17 is connected to the main line 25 for the functional block 19 through the sub-lines 27 extending in the Y direction, and is connected to the main line 24 for the functional block 18 through the sub-lines 27 extending in the X direction. Similarly, the main line 24 related to the functional block 18 is connected to both the main lines 25 and 26 through the sub-lines 27 extending in the Y direction. The sub-lines 27 further connect the main lines 23-26 to a trunk line 29, which is laid along the ends of the chip 100, and positioned between the I/O circuit block 21 and the functional blocks 23-26. Power source pads 30 provided in the I/O circuit block 21 are electrically connected to the trunk power source line 29. A line A denotes an imaginary boundary of the I/O circuit block 21 and an internal area in which the functional blocks 17-20 are located.

Each of the functional blocks 17-20 provided in the internal area surrounded by the trunk power source line 29 is formed as follows. A plurality of unit cell arrays 22 (only two arrays are illustrated for the sake of simplicity in FIG. 2) are provided in the X direction. Each of the unit cells forms a logic unit such as a NAND circuit. First local (auxiliary) power source lines (hereinafter simply referred to as first local lines) 28 related to the functional block 19 extend in the Y direction and are connected between opposite portions 25a and 25b of the sub-line 25 which extend in the X direction. The first local lines 28, which are illustrated by broken lines, are arranged at predetermined constant intervals. Alternatively, different sets of the adjacent first local lines 28 may be arranged at different intervals. Second local power source lines (hereinafter simply referred to as second local lines) 32 extend in the X direction and are connected between opposite portions 25c and 25d of the sub-line 25 which extend in the Y direction. The second local lines 32 are interposed between the adjacent unit cell arrays 22 or between each of the unit cell arrays 22 and each of the portions 25a and 25b of the sub-line 25. The number of second local lines 32 is not limited to one as illustrated in FIG. 2, and an arbitrary number of second local lines 32 may be arranged between the adjacent unit cell arrays 22 or on the side of each of the unit cell arrays 22 which face the portions 25a and 25b of the main lines 25 extending in the X direction. Third local power source lines (hereinafter simply referred to as third local lines) 33 extend in the X direction and are laid on an insulating layer (not shown) formed on the unit cell arrays 22. The third local lines 33 are connected between the opposite portions 25c and 25d of the sub-line 25 which extend in the Y direction. A "black" dot denotes a via (through or contact) hole. For example, the first local lines 28 are in contact with the unit cells through via holes and in contact with second and third local lines 32 and 33 through via holes. Via holes may be formed at intersecting points where the lines extending in the different directions intersect or may be formed in the vicinity thereof.

Figure 3:
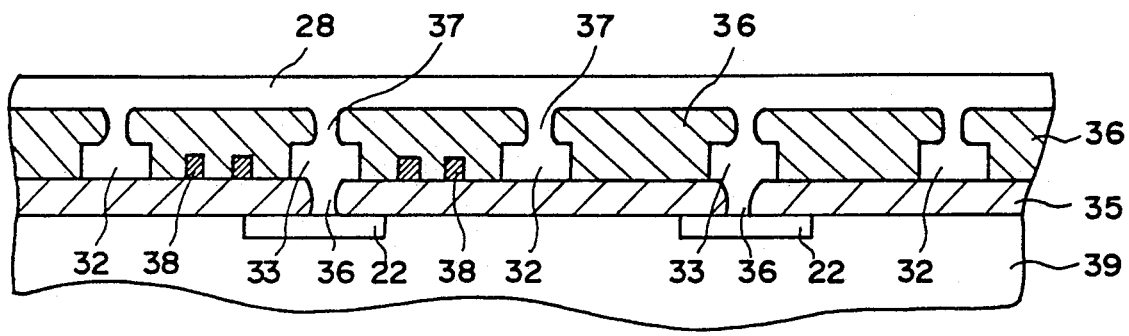
FIG. 3 is a cross sectional view taken along line III—III shown in FIG. 2.

FIG. 3 is a cross sectional view taken along line III—III shown in FIG. 2. An insulating layer 35 is deposited on the unit cell arrays 22 formed in a semiconductor substrate 39. The second and third local lines 32 and 33 extend on the insulating layer 35 in the X direction. The third local lines 33 are in contact with the corresponding unit cell arrays 22 through via holes 36 formed in the insulating layer 35. Signal lines 38 are also formed on the insulating layer 35. The second and third local lines 32 and 33, and the signal lines 38 positioned at a lower layer level are covered by an insulating layer 35, on which the first local line 28 extending in the Y direction is formed. The first local line 28 positioned at an upper layer level is in contact with the second and third local lines 32 and 33 through via holes 37 formed in the insulating layer 36. The trunk power source line 29 (not shown in FIG. 3) is located at the upper or lower layer level.

It is preferable that the sub-lines 27 are wider than the local lines 28, 32 and 33, and the main lines 23-26 are wider than the sub-lines 27. For example, W1: W2: W3 are set to 8:4:1 where W1 is the width of each main line, W2 is the width of each sub-line, and W3 is the width of each local line.

Figure 4:
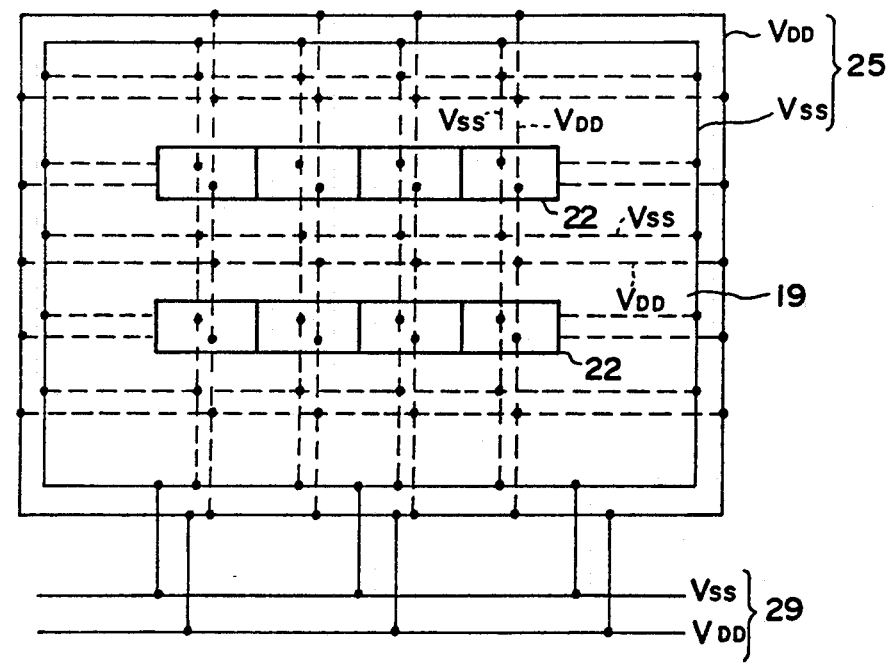
FIG. 4 is a detailed diagram illustrating a layout of local power source lines related to a functional block according to the first embodiment.

It is noted that the main lines 23-26, the sub-lines 27, and the local lines 28, 32 and 33 are of the same potential equal to a power source voltage $V_{DD}$. Power source lines of a different potential equal to a power source voltage $V_{SS}$ are arranged in the same manner as the power source lines of $V_{DD}$ as shown in FIG. 4. The arrangement shown in FIG. 4 can be achieved by use of a multilevel layer structure.

Figure 5A:
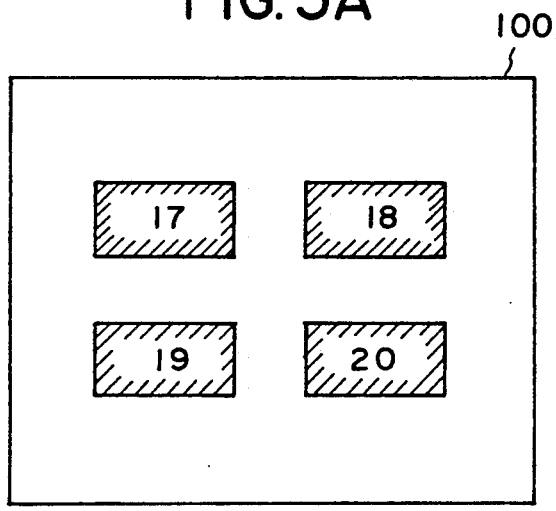
FIGS. 5A through 5F are views illustrating a procedure of automatically routing power source lines by use of CAD.
Figure 5C:
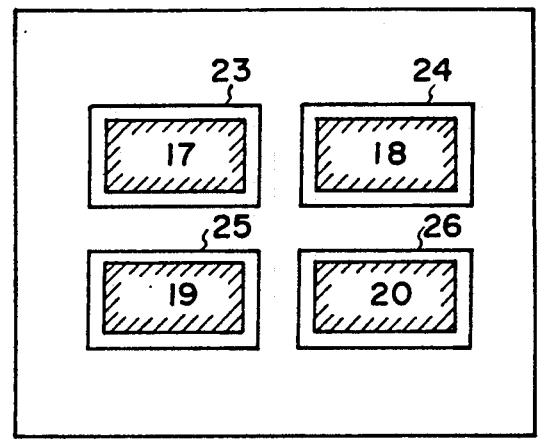
Figure 5B:
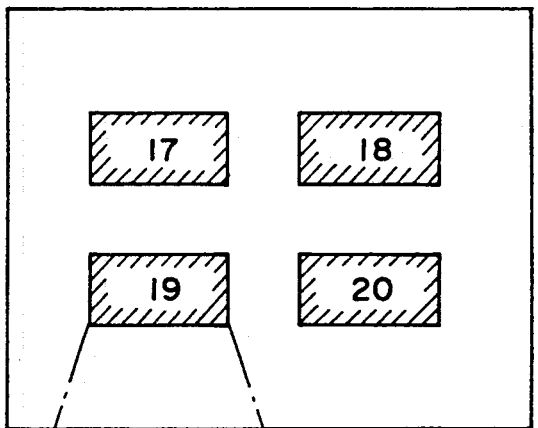
Figure 5D:
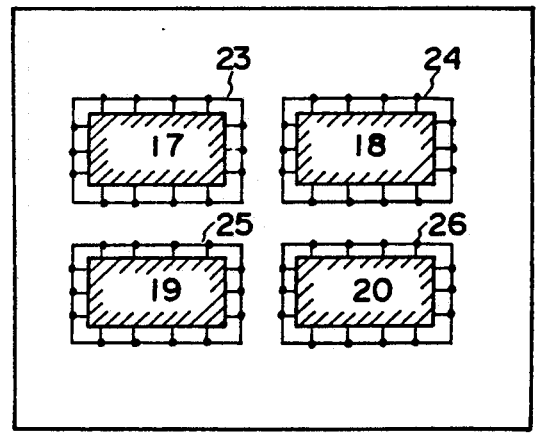
Figure 5D:
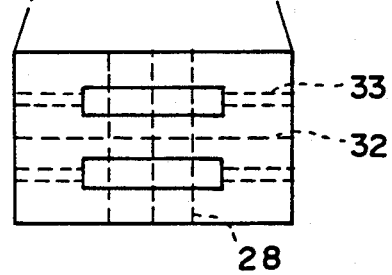
Figure 5E:
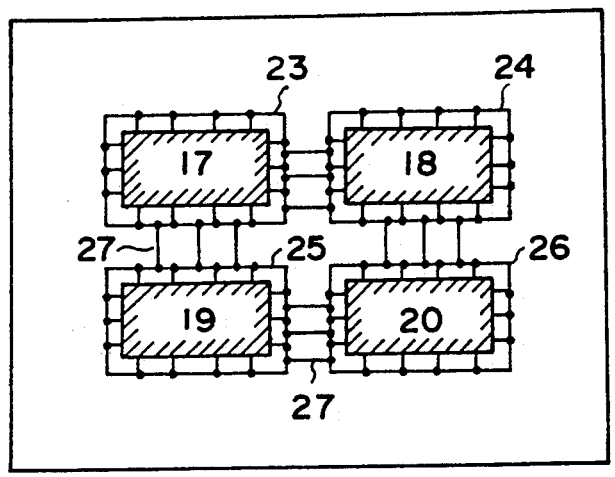
Figure 5F:
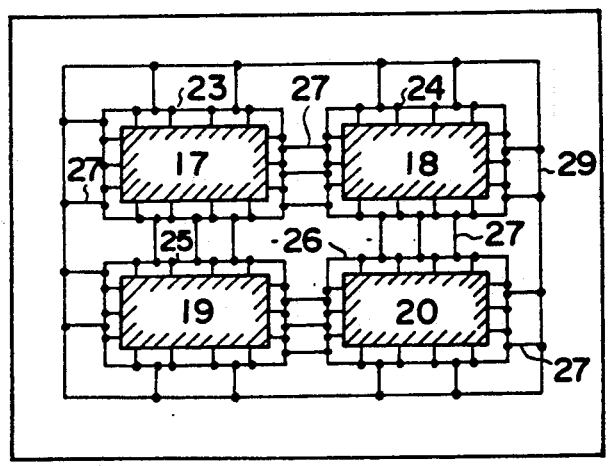

A description is given of a procedure for designing a layout of power source lines by use of CAD with reference to FIGS. 5A through 5F. Referring to FIG. 5A, the layout of the functional blocks 17-20 on the chip 100 are determined. The illustrated areas of the functional blocks 17-20 shown in FIGS. 5A through 5F are of the same size for convenience' sake. Next, as shown in FIG. 5B, the internal power source lines arranged in each of the functional blocks 17-20 are designed. That is, the layout of the first, second and third local lines 28, 32 and 33 are determined. At this time, the arrangement of signal lines 38 (FIG. 3) in the functional blocks 17-20 is determined. Then, as shown in FIG. 5C, the main lines 23-26 to be arranged around the functional blocks 17-20 are determined. Thereafter, as shown in FIG. 5D, lines which connect the first to third local lines (power source terminals) provided in the functional blocks 17-20 and the relative main lines 23-26 are routed. After that, the layout of signal lines between the functional blocks 17-20 is determined. Then, as shown in FIG. 5E, the sub-lines 27 are routed so as to connect the main lines 23-26. Finally, as shown in FIG. 5F, the sub-lines 27 connecting the trunk power source line 29 and the main lines 17-20 are routed. It is noted that the above-mentioned procedure is somewhat different from an actual production procedure.

Figure 6:
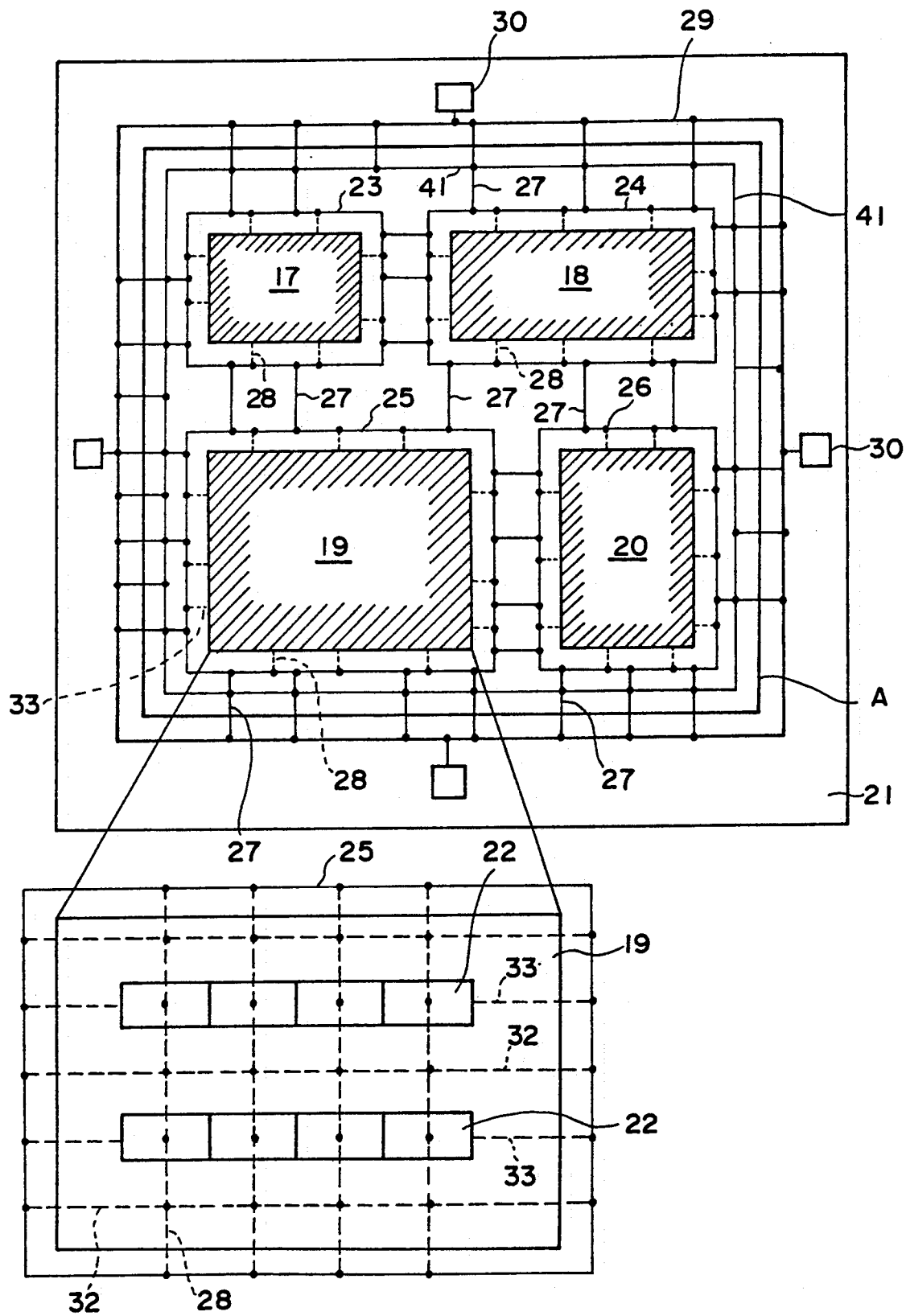
FIG. 6 is a plan view of a second preferred embodiment of the present invention.

A description is given of a second embodiment of the present invention with reference to FIG. 6, in which those parts which are the same as those shown in FIG. 2 are given the same reference numerals. An essential feature of the second embodiment is that a power source line 41 is arranged along the trunk power source line 29 so as to surround the internal area in which the functional blocks 17-20 are formed. The power source line 41 functions to make uniform the distribution of voltage (current) of the power source lines in the chip.

Figure 7:
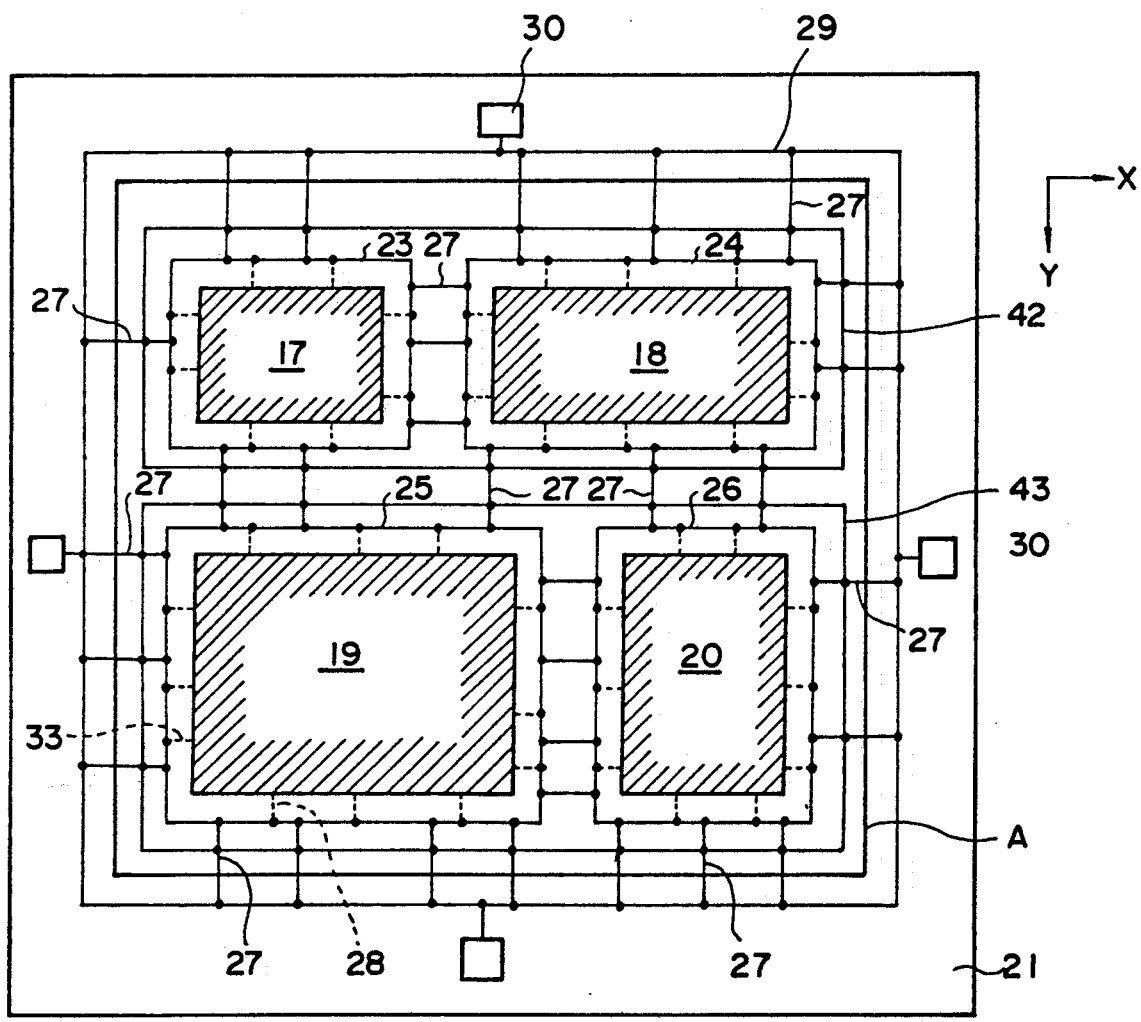
FIG. 7 is a plan view of a third preferred embodiment of the present invention.

FIG. 7 is a diagram of a third embodiment of the present invention. In FIG. 7, those parts which are the same as those in FIGS. 2 and 6 are given the same reference numerals. An essential feature of the third embodiment is that a power source line 42 is arranged so as to surround the functional blocks 17 and 18, and a power source line 43 is arranged so as to surround the functional blocks 19 and 20. The third embodiment can present the same advantage as the second embodiment.

Figure 8:
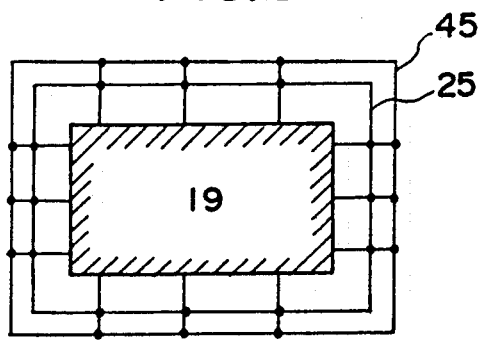
FIG. 8 is a diagram illustrating a layout of main power source lines related to a functional block according to a fourth preferred embodiment of the present invention.

FIG. 8 is a diagram illustrating a layout of main power source lines related to a functional block according to a fourth preferred embodiment of the present invention. Referring to FIG. 8, a main power source line 45 is arranged so as to surround the functional block 19 in addition to the main line 25. The main line 45 is connected to the local lines extending from the functional block 19. The arrangement shown in FIG. 8 is applicable to the other functional blocks 17, 18 and 20. The arrangement of the fourth embodiment makes uniform the distribution of voltage (current) of the power source lines in the chip.

Figure 9:
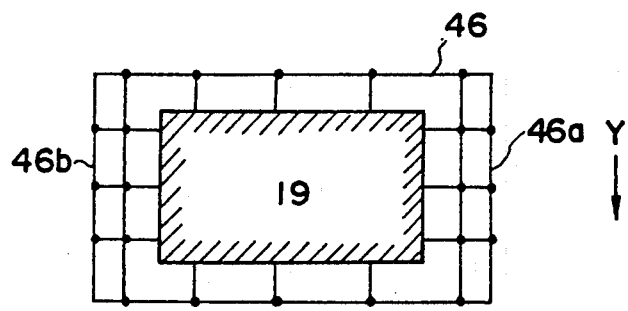
FIG. 9 is a diagram illustrating a layout of main power source lines related to a functional block according to a fifth preferred embodiment of the present invention.

FIG. 9 is a diagram illustrating a layout of main power source lines related to a functional block according to a fifth preferred embodiment of the present invention. Referring to FIG. 9, a main power source line 46 has branch lines 46a and 46b extending in the Y direction. In other words, each of the line portions extending in the Y direction has a duplex arrangement. It is expected that a large amount of current passes through the duplex portions.

It is noted that it is not preferable to replace a duplex line portion such as portion 45a or 45b by a single wider line because a crack is liable to occur in wider lines. Alternatively, it is possible to use only the branch line 46a or 46b. An additional branch may be used in addition to the branches 46a and 46b at a different end of the loop.

Figure 10:
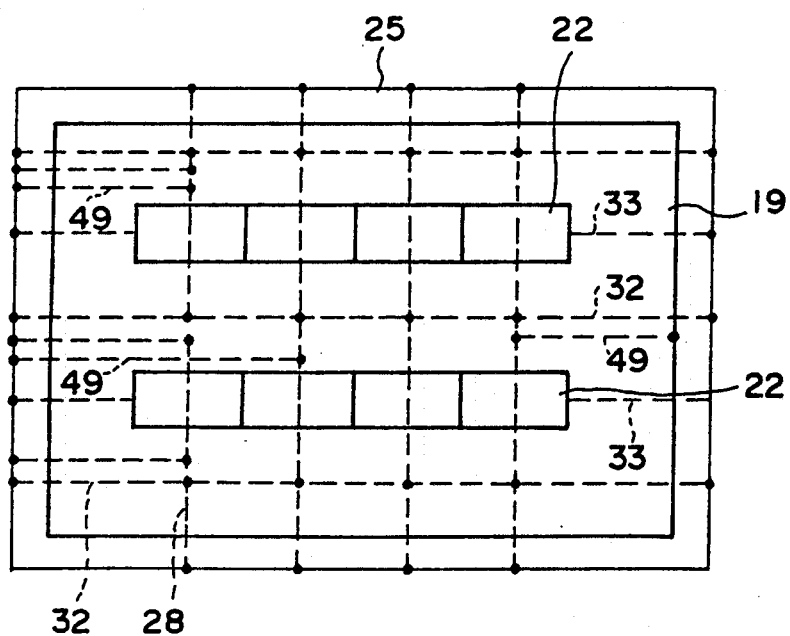
FIG. 10 is a diagram illustrating a variation of arrangement of local power source lines related to a functional block.

FIG. 10 is a diagram illustrating a variation of local power source lines extending in the X direction. Local power source lines 49 extending in the X direction are provided in a dead portion of a channel area. The local power source lines 49 contribute to making the distribution of voltage (current) uniform in the functional block 19. The arrangement of FIG. 10 is applicable to the other functional blocks.

Figure 11:
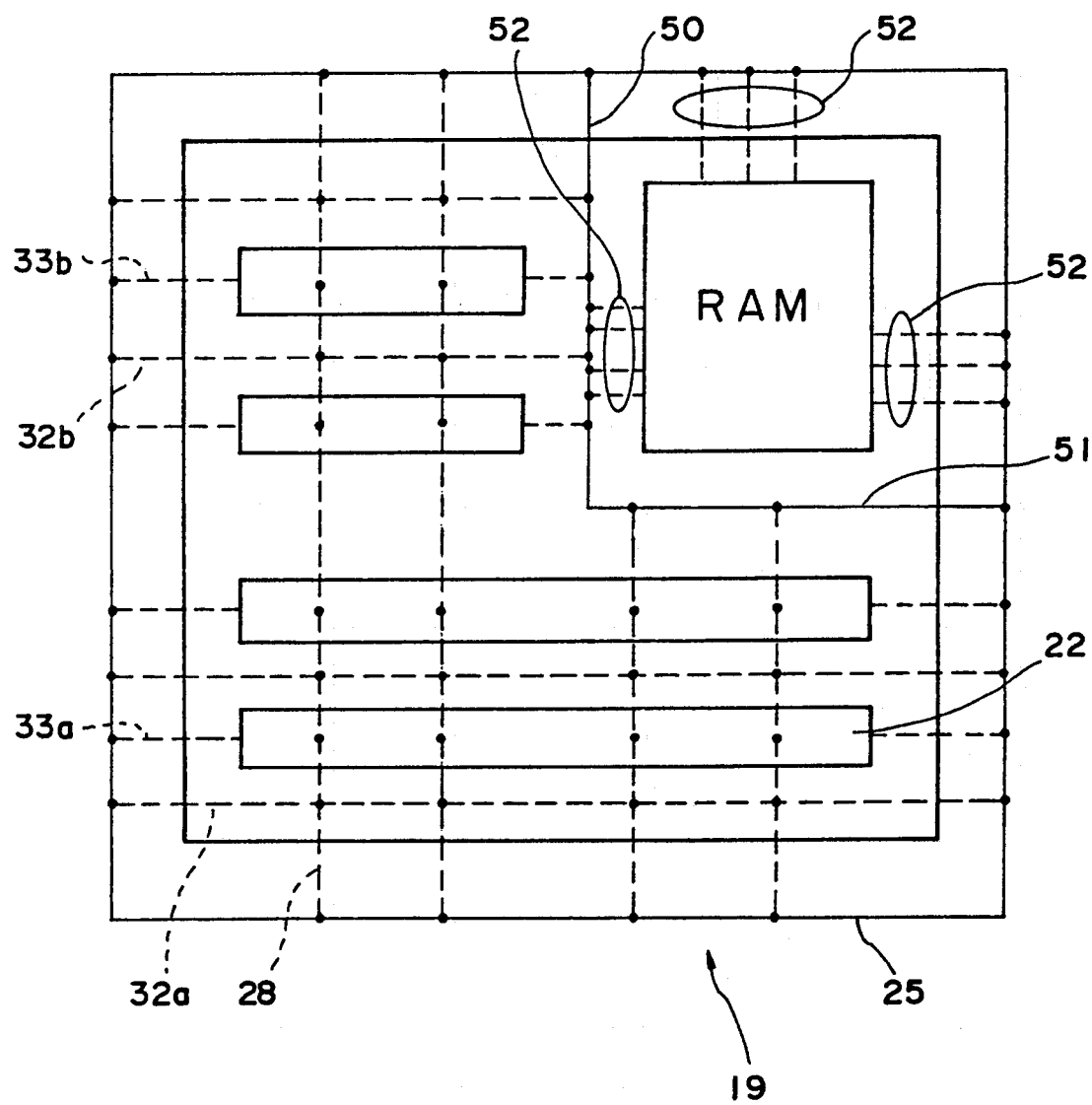
FIG. 11 is a diagram of an arrangement of power source lines related to a functional block in which there is provided a macrocell such as a RAM.

FIG. 11 illustrates an arrangement of power source lines associated with the functional block 19 in a case where the functional block 19 has a macrocell such as a RAM. The RAM provided in the functional block 19 together with the unit cell arrays 22 is surrounded by a part of the main line 25 and sub-lines 50 and 51. The sub-lines 50 and 51 extend in the Y and X directions, respectively. The sub-line 50 has the same width as the sub-line 27, and the sub-line 51 has the same width as each of the local lines 32, 33 and 28. Local lines 52 are provided so as to connect power source terminals of the RAM and the main line 25. Further, local lines 52 are provided so as to connect power source terminals of the RAM and the sub-lines 50 and 51. In this case, local lines 33b and 32b extending in the X direction are connected to the sub-line 50. The arrangement shown in FIG. 11 can automatically be routed even when a macrocell such as a RAM is provided in a functional block.

Figure 12:
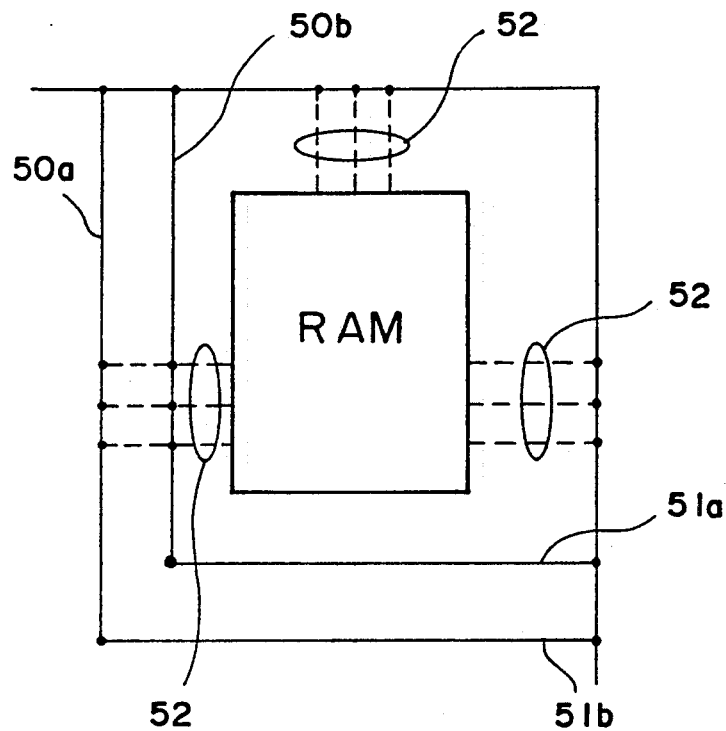
FIGS. 12 and 13 are diagrams of a variation of the arrangement shown in FIG. 11.
Figure 13:
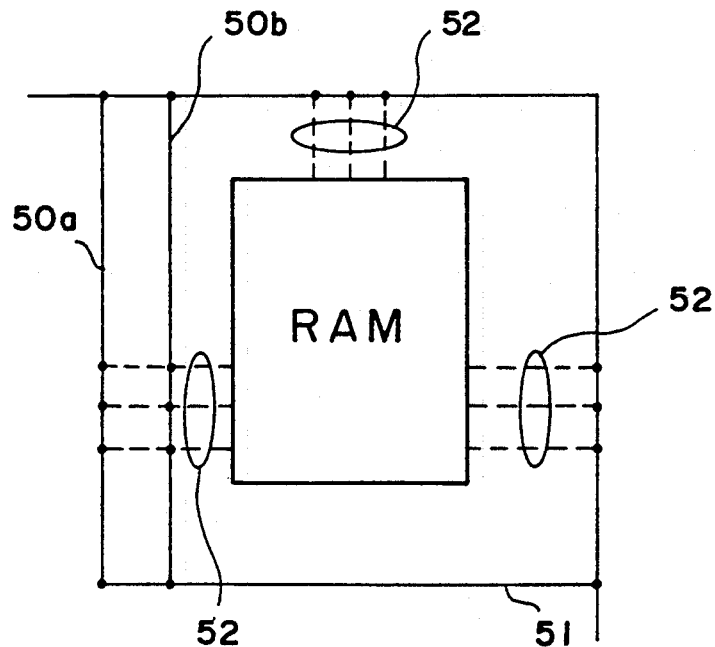

FIG. 12 illustrates a variation of the arrangement shown in FIG. 11. The sub-line 50 shown in FIG. 11 is formed by two sub-lines 50a and 50b extending in the Y direction. Similarly, the sub-line 51 shown in FIG. 11 is formed by two sub-lines 51a and 51b. An increased number of sub-lines 50 and 51 makes it possible to supply the RAM with sufficient power. The number of sub-lines 50 can arbitrarily be selected independent of the number of sub-lines 51 in view of necessary power. In FIG. 13, the sub-line 51 is a single line.

Figure 14:
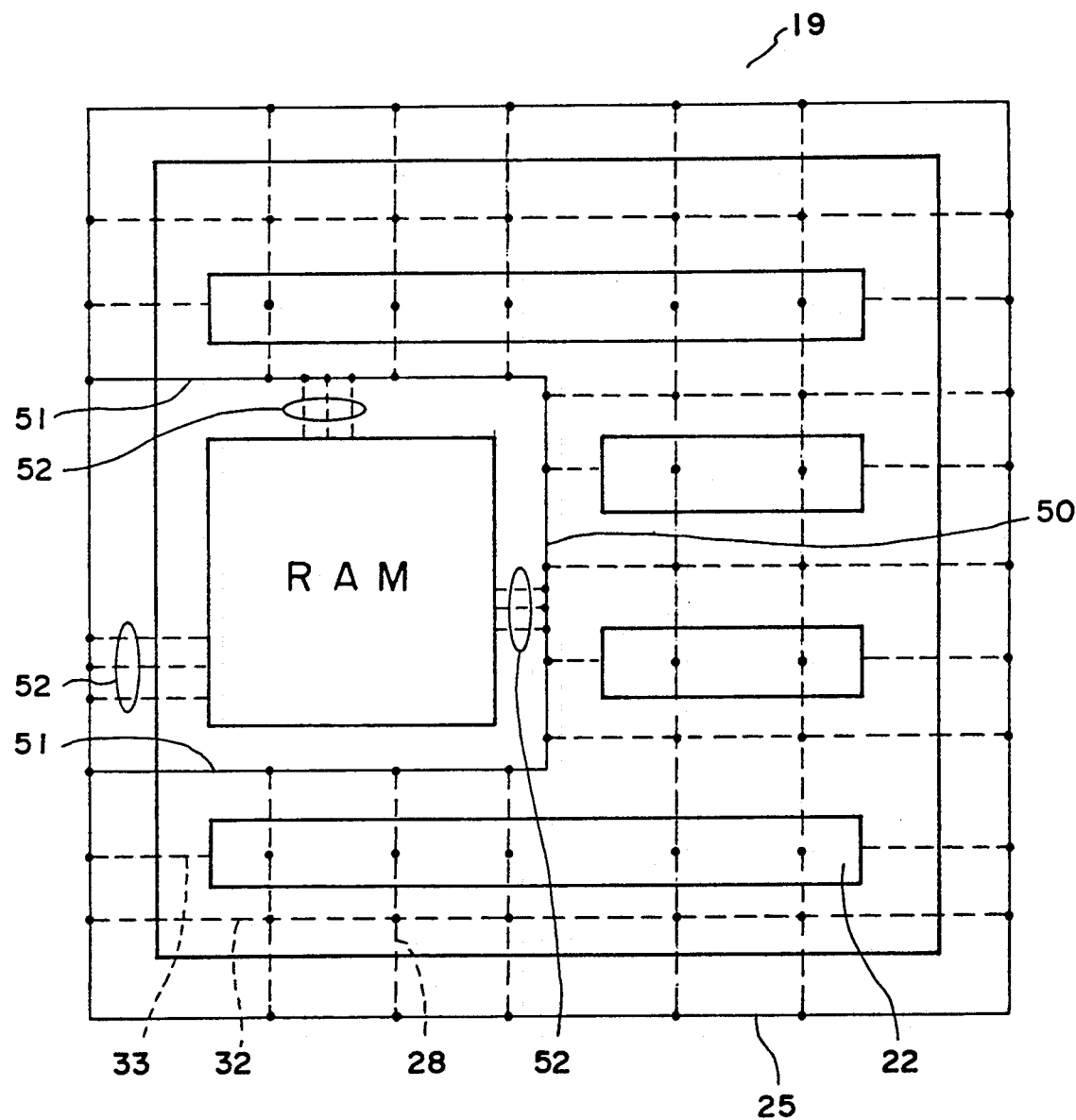
FIG. 14 is a diagram of another variation of the arrangement shown in FIG. 11.
Figure 15:
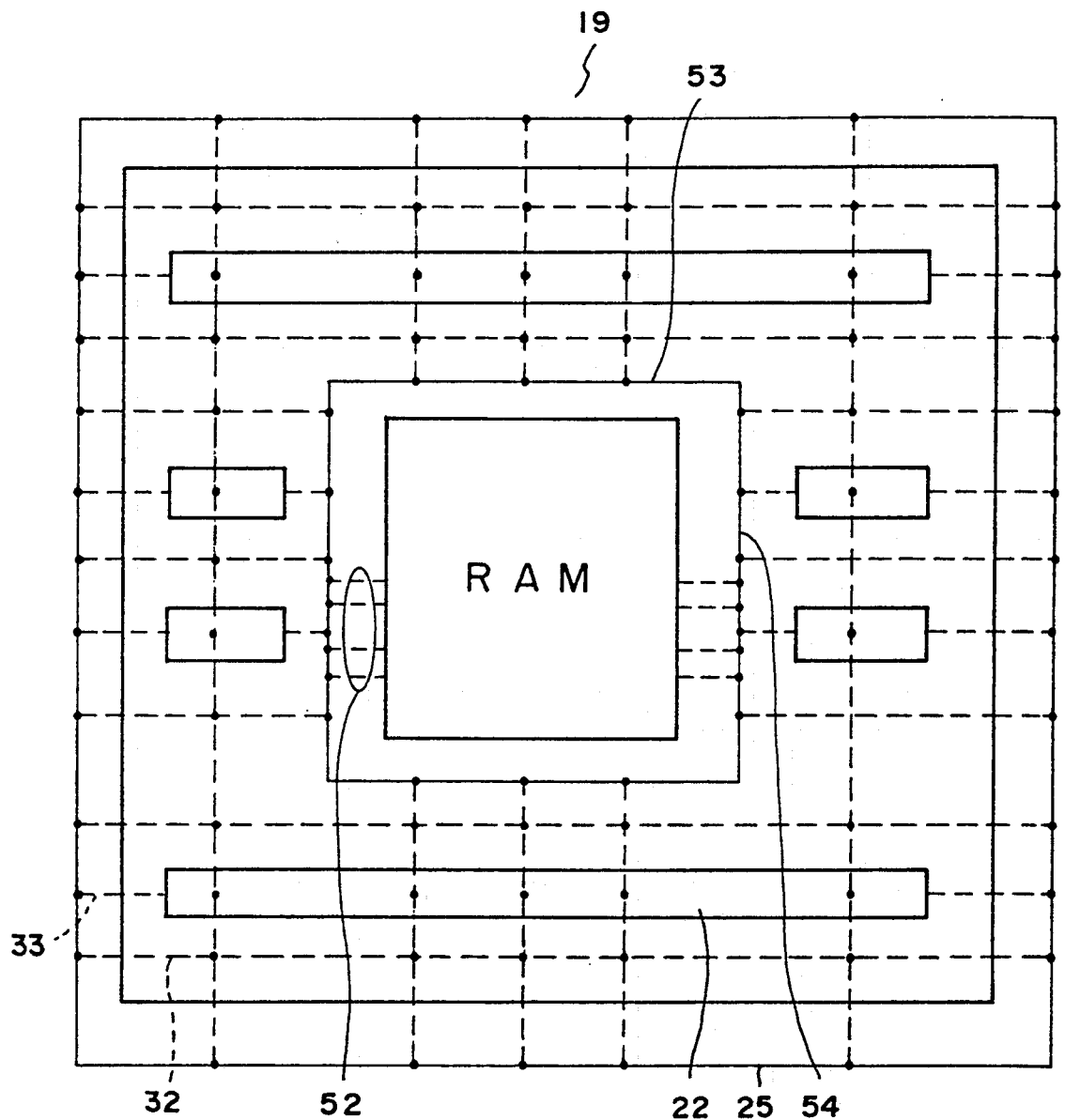
FIG. 15 is a diagram of still another variation of the arrangement shown in FIG. 11.

FIGS. 14 and 15 illustrate different variations of the arrangement shown in FIG. 11. The RAM shown in each of FIGS. 14 and 15 is positioned differently from the RAM shown in FIG. 11. The RAM shown in FIG.

14 is surrounded by a part of the main line 25 and sub-lines 50 and 51. Power source terminals of the RAM shown in FIG. 14 are connected to the main line 25 and the sub-lines 50 and 51 through local lines 52. The RAM shown in FIG. 15 is surrounded by sub-lines 53 and 54. Power source terminals of the RAM are connected to the sub-line 54 through local lines 52 extending in the X direction. Each of the lines 52 has the same width as the sub-line 27.

The present invention is not limited to the aforementioned embodiments, and variations and modifications may be made without departing from the scope of the claimed invention.

What is claimed is:

1. A semiconductor integrated circuit device comprising:
    a plurality of functional blocks each executing respective logic operations and arranged in an internal area on a semiconductor chip;
    a first power source line arranged so as to surround said internal area and said plurality of functional blocks, said first power source line being a closed-loop line;
    second power source lines provided for each functional block of said plurality of functional blocks so as to surround each functional block on said chip, each of said second power source lines being a closed-loop line; and
    third power source lines mutually connecting said second power source lines of said functional blocks and connecting said second power source lines and said first power source line, said third power source lines connecting said second power source lines with other second power source lines and said second power source lines with said first power source line at a plurality of portions on said first and second power source lines.

2. A semiconductor integrated circuit device as claimed in claim 1, wherein each of said functional blocks includes a plurality of arrays each including unit cells each forming a logic unit, and wherein said semiconductor integrated circuit device further comprises a plurality of fourth power source lines which extend in the direction perpendicular to the direction of each of said arrays and are connected between opposite portions of related one of said second power source lines so that said unit cells are supplied with power through said fourth power source lines.

3. A semiconductor integrated circuit device as claimed in claim 2, further comprising a plurality of fifth power source lines which extend in the same direction as each of said arrays and are connected between opposite portions of related one of said second power source lines so that said unit cells are supplied with power through not only said fourth power source lines but also fifth power source lines.

4. A semiconductor integrated circuit device as claimed in claim 3, wherein said fifth power source lines include power source lines arranged between adjacent arrays among said plurality of arrays.

5. A semiconductor integrated circuit device as claimed in claim 4, wherein at least two power source lines included in said fourth power source lines are arranged between the adjacent arrays of unit cells.

6. A semiconductor integrated circuit device as claimed in claim 3, wherein said fifth power source lines include power source lines extending above said arrays.

7. A semiconductor integrated circuit device as claimed in claim 3, wherein said fourth and fifth power source lines are formed at different layer levels, and are in contact with each other through via holes.

8. A semiconductor integrated circuit device as claimed in claim 1, wherein said second power source lines include a duplex portion made up of a first line and a second line extending in parallel with each other.

9. A semiconductor integrated circuit device as claimed in claim 1, further comprising a sixth power source line arranged so as to surround said internal area and extend along said first power source line, and said sixth power source line is connected to said first and second power source lines through said third power source lines.

10. A semiconductor integrated circuit device as claimed in claim 1, wherein said functional blocks are classified into a plurality of groups, and said semiconductor integrated circuit device further comprises a seventh power source line arranged so as to surround each of said groups of functional blocks, and wherein said seventh power source lines provided for each said group of functional blocks are connected to said first and second power source lines by said third power source lines.

11. A semiconductor integrated circuit device as claimed in claim 1, further comprising an eighth power source line arranged so as to surround each of said plurality of functional blocks and extend along with one of said second power source lines, wherein said eighth power source lines provided for said functional blocks are connected to said first and second power source lines by said third power source lines.

12. A semiconductor integrated circuit device as claimed in claim 1, wherein said first power source line is wider than said second power source lines.

13. A semiconductor integrated circuit device as claimed in claim 1, wherein said second power source lines are wider than said third power source lines.

14. A semiconductor integrated circuit device as claimed in claim 1, wherein said first, second and third power source lines are of the same potential.

15. A semiconductor integrated circuit device comprising:
    a plurality of functional blocks each executing respective logic operations and arranged in an internal area on a semiconductor chip;
    a first high-potential power source line arranged so as to surround said internal area and said plurality of functional blocks, said high-potential first power source line being a closed-loop line;
    second high-potential power source lines provided for each functional block of said plurality of functional blocks so as to surround each functional block on said chip, each of said second high-potential power source lines being a closed-loop line;
    third high-potential power source lines mutually connecting said second high-potential power source lines of said functional blocks and connecting said second high-potential power source lines and said first high-potential power source line, said third high-potential power source lines connecting said second high-potential power source lines with other second high-potential power source lines and said second high-potential power source lines with said first high-potential power source line at a plurality of first portions on said first and second high-potential power source lines;

a first low-potential power source line arranged so as to surround said internal area and said plurality of functional blocks, said first low-potential power source line being a closed-loop line;

second low-potential power source lines provided for each functional block of said plurality of functional blocks so as to surround each functional block on said chip, each of said second low-potential power source lines being a closed-loop line; and third low-potential power source lines mutually connecting said second low-potential power source lines of said functional blocks and connecting said low-potential second power source lines and said first low-potential power source line, said third low-potential power source lines connecting said second low-potential power source lines with other second high-potential power source lines and said second low-potential power source lines with said first high-potential power source line at a plurality of second portions on said first and second low-potential power source.

16. A semiconductor integrated circuit device as claimed in claim 15, wherein each of said functional blocks includes a plurality of arrays each including unit cells each forming a logic unit, and wherein said semiconductor integrated circuit device further comprises a plurality of fourth high-potential power source lines which extend in the direction perpendicular to the direction of each of said arrays and are connected between opposite portions of related one of said second high-potential power source lines, and a plurality of fourth low-potential power source lines which extend in the direction perpendicular to the direction of each of said arrays and are connected between opposite portions of related one of said second low-potential power source lines.

17. A semiconductor integrated circuit device as claimed in claim 16 further comprising a plurality of fifth high-potential power source lines which extend in the same direction as each of said arrays and connected between opposite portions of related one of said second high-potential power source lines, and a plurality of fifth low-potential power source lines which extend in the same direction as each of said arrays and are connected between opposite portions of related one of said second high-potential power source lines.

18. A semiconductor integrated circuit device as claimed in claim 17, wherein said fifth high-potential power source lines include power source lines arranged between adjacent arrays among said plurality of arrays, and said fifth low-potential power source lines include power source lines arranged between adjacent arrays among said plurality of arrays.

19. A semiconductor integrated circuit device as claimed in claim 16, wherein said fifth high-potential power source lines include power source lines extending above said arrays, and said fifth low-potential power source lines include power source lines extending above said arrays.

* * * * *